United States Patent [19]

Hida et al.

[11] Patent Number: 5,221,647
[45] Date of Patent: Jun. 22, 1993

[54] SIALON PRECURSOR COMPOSITION

[75] Inventors: George T. Hida; Rodica S. Hida, both of Amherst, N.Y.

[73] Assignee: Benchmark Structural Ceramics Corporation, Amherst, N.Y.

[21] Appl. No.: 805,081

[22] Filed: Dec. 11, 1991

Related U.S. Application Data

[63] Continuation-in-part of Ser. No. 722,104, Jun. 27, 1991, and a continuation-in-part of Ser. No. 535,035, Jun. 7, 1990, Pat. No. 5,030,600, and a continuation-in-part of Ser. No. 365,606, Jun. 13, 1989, abandoned, and a continuation-in-part of Ser. No. 364,014, Jun. 9, 1989, abandoned, and a continuation-in-part of Ser. No. 339,137, Apr. 14, 1989, Pat. No. 4,957,885, and a continuation-in-part of Ser. No. 254,175, Oct. 6, 1988, Pat. No. 5,006,290.

[51] Int. Cl.$^5$ ............................................. C04B 35/58
[52] U.S. Cl. ...................................... 501/98; 501/87; 501/88; 501/91; 501/92; 501/95; 501/96
[58] Field of Search ................. 501/98, 95, 87, 88, 501/91, 92, 96

[56] References Cited

U.S. PATENT DOCUMENTS

| | | | |
|---|---|---|---|
| 4,845,061 | 7/1989 | Inoguchi et al. | 501/98 |
| 4,935,389 | 6/1990 | Umebayashi et al. | 501/98 |
| 5,030,600 | 7/1991 | Hida et al. | 501/98 |

Primary Examiner—Mark L. Bell
Assistant Examiner—Deborah Jones
Attorney, Agent, or Firm—Howard J. Greenwald

[57] ABSTRACT

A precursor material is disclosed. This precursor material is comprised of at least about 16 weight percent of beta-sialon, from about 54 to about 28 weight percent of alumina, from about 0 to about 8 weight percent of aluminum nitride, from about 0 to about 25 weight percent of silicon nitride, and from about 30 to about 24 weight percent of free silicon.

6 Claims, 1 Drawing Sheet

SIALON PRECURSOR COMPOSITION

CROSS-REFERENCE TO RELATED PATENT APPLICATIONS

This is a continuation-in-part of copending application U.S. Ser. Nos. 07/722,104 (filed Jun. 27, 1991), 07/535,035 (filed Jun. 7, 1990) now U.S. Pat. No. 5,030,600, U.S. Ser. No. 07/365,606 (filed Jun. 13, 1989) now abandoned, U.S. Ser. No. 07/364,014 (filed Jun. 9, 1989) now abandoned, U.S. Ser. No. 339,137 (filed Apr. 14, 1989) now U.S. Pat. No. 4,957,885, and U.S. Ser. No. 254,175 (filed Oct. 6, 1988) now abandoned.

FIELD OF THE INVENTION

A precursor which may be used to prepare a sialon material is disclosed; the precursor contains sialon, alumina, and free silicon.

BACKGROUND OF THE INVENTION

George T. Hida et al. U.S. Pat. No. 5,030,600 discloses a composite material containing at least 70 weight percent of single-phase beta sialon and at least 20 weight percent of alpha-alumina. Although the composite material of this patent has excellent mechanical and thermal properties, the oxidation resistance of such material, after exposure to temperatures in excess of 1,200 degrees Centigrade, is often less than ideal.

It is an object of this invention to provide a precursor composition which may be used to prepare a beta-sialon material which has substantially better oxidation resistance properties than the oxidation resistance properties of the beta-sialon compositions of U.S. Pat. No. 5,030,600.

It is another object of this invention to provide a novel precursor material comprised of free silicon, alumina, and beta-sialon, wherein the precursor material, upon being heated, will form a sialon bond phase and will bond oxide or nonoxide material (such as, e.g., cordierite, zirconia, silicon carbide, siicon nitride, titanium nitride, and boron nitride).

It is yet another object of this invention to provide a novel, bonded material comprised of oxide or nonoxide material and beta-sialon.

It is another object of this invention to provide a process for preparing said precursor material.

It is yet another object of this invention to provide a process for heat-treating said precursor material to form the beta-sialon composition.

It is another object of this invention to provide a beta-sialon composition whose mechanical properties are superior to those of the composite material of U.S. Pat. No. 5,030,600.

It is another object of this invention to provide a novel process for preparing the beta-sialon material of this invention.

It is an additional object of this invention to provide a beta-sialon composition which can be sintered without pressure into a high-density body which possesses good mechanical and thermal properties.

It is another object of this invention to provide a beta-sialon composition which can be sintered without the use of sintering aids.

It is another object of this invention to provide a novel sintering aid comprised or consisting of beta-sialon which may be used to facilitate the sintering of many nonoxide materials.

It is another object of this invention to provide a novel sintering aid which, under the conditions commonly used in sintering, produces an intergranular sialon crystalline phase.

It is another object of this invention to provide a novel sintered ceramic material comprised of crystalline beta-sialon which has superior mechanical and/or thermal properties.

It is another object of this invention to provide a pellet which can be used to produce the precursor material of this invention.

It is another object of this invention to provide a beta-sialon composition which is reinforced and has improved mechanical properties.

It is another object of this invention to provide a primarily synthesized beta-sialon composition.

It is yet another object of this invention to provide a controlled, self-sustaining, highly-exothermic process for the production of a beta-sialon material at a cost substantially less than that presently incurred for the preparation of the prior art "Sialon" materials.

SUMMARY OF THE INVENTION

In accordance with this invention, there is provided a precursor material which is comprised of at least about 16 weight percent of beta-sialon, from about 54 to about 28 weight percent of alumina, from about 0 to about 8 weight percent of aluminum nitride, from about 0 to about 25 weight percent of silicon nitride, and from about 30 to about 24 weight percent of free silicon.

DESCRIPTION OF THE DRAWING

The present invention will be more fully understood by reference to the following detailed description thereof, when read in conjunction with the attached drawings, wherein like reference numerals refer to like elements and wherein.

DESCRIPTION OF THE PREFERRED EMBODIMENTS

Figure 1:
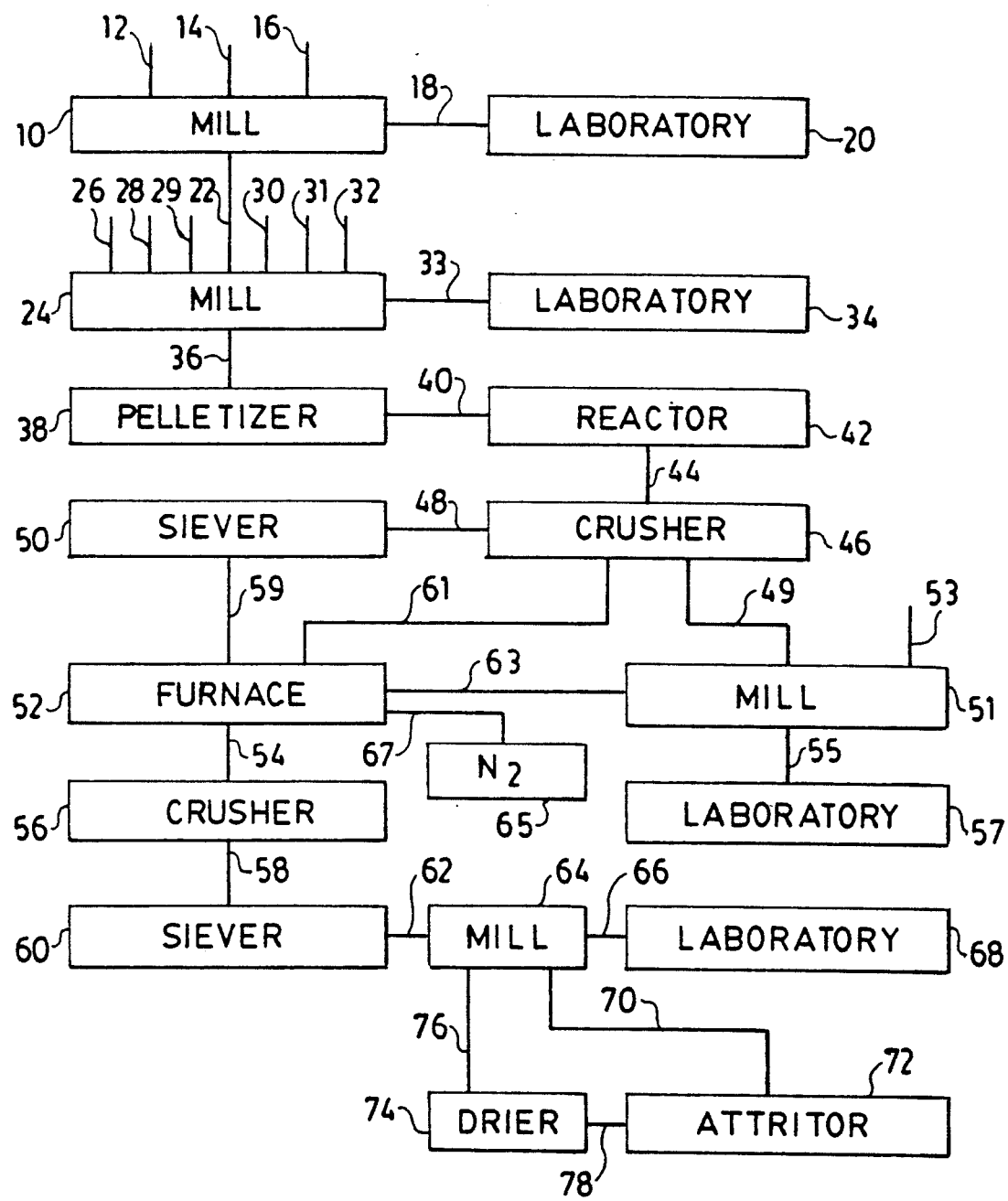
FIG. 1 is a flow sheet of a preferred embodiment of the process of this invention.

The sialon material produced by the process of this invention is primarily synthesized. The term "primarily synthesized" is described in U.S. Pat. No. 5,030,600, the entire disclosure of which is hereby incorporated by reference into this specification. Thus, as will be apparent to those skilled in the art, the sialon material of this invention is a single-phase material which preferably has no replacable cations. In the majority of crystal lattices of this sialon material, only silicon, aluminum, oxygen, and nitrogen atoms preferably appear.

In one embodiment, the material produced by the process of this invention is a composite material and, thus, contains more than one phase. The meaning of the term "phase" is well known to those skilled in the art and is also described in U.S. Pat. No. 5,030,600.

Thus, by way of illustration, in one embodiment the material of this invention is comprised of at least two phases. The phases in the composite material are preferably selected from the group consisting of single-phase beta-sialon with the formula $Si_{6-z}Al_zO_zN_{8-z}$ (wherein z is from about 2.5 to about 3.5) and single-phase alpha-alumina.

The final material produced by the process of this invention comprises at least about 73 weight percent of said single-phase beta-sialon described above, wherein z is from about 2.5 to about 3.5. It is preferred that the material comprise at least about 82 weight percent of said single-phase beta sialon. It is more preferred that the material comprise at least about 89 weight percent of said single-phase beta-sialon. In an even more preferred embodiment, the material comprises at least about 95 percent of said single-phase beta-sialon.

In one preferred embodiment, at least about 99 percent of the final material produced by the process of this invention is comprised of said single-phase beta-sialon. The substantially pure beta-sialon material of this embodiment may be used to prepare a composite material when such material is infiltrated into continuous fiber, such as, e.g., silicon carbide continuous fiber. The infiltrated green body thus produced can be hot-pressed at relatively low temperatures, thereby producing a densified product which physical properties which are superior to those obtained with composites made from prior art beta-sialon materials.

Without wishing to be bound to any particular theory, applicants believe that the beta-sialon material prepared by the heat-treatment process of their invention produces this advantageous result because it is single-phase and does not contain replacable cations, such as the yttrium, zirconium and magnesium cations which are commonly present in prior art beta-sialon materials (which are solid solutions).

In one embodiment of this invention, in which a composite material is produced, the process of this invention prepares a composite material which comprises from about 1 to about 27 weight percent of alpha alumina and, more preferably, from about 1 to about 18 weight percent of alpha-alumina. In an even more preferred embodiment, the composite material contains from about 1 to about 11 weight percent of said alpha-alumina. In most preferred aspect of this embodiment, the composite material is comprised of from about 1 to about 5 weight percent of such alpha alumina.

The material of this invention may be sintered without pressure and without the use of sintering aids. It is preferred, however, to mix such material with a binder prior to forming it. Thus, by way of illustration, one may use the binders described in U.S. Pat. No. 5,030,600.

The material of this invention, when formed into a green body and sintered in accordance with a test of sintered cylinders described in U.S. Pat. No. 5,030,600, has certain specified properties. Thus, the sintered cylinders: (1)have a density of from about 93.0 to about 99.1 percent of its theoretical density (and, in general, have a density of from about 3.05 to about 3.25 grams per cubic centimeter), (2)have an elastic modulus of from about 250 to about 350 gigaPascals (as tested in accordance with A.S.T.M. Standard Test C-848-78), (3)have a flexural strength of from about 450 to about 1000 megaPascals (and, preferably, from about 600 to about 1000 megaPascals), as tested in accordance with A.S.T.M. Standard Test F-417-78, (4)have a wear resistance (as expressed as a loss of material volume) of from about 28 to about 20 cubic millimeters per 100 revolutions (and, preferably, from about 24 to about 20 cubic millimeters per 100 revolutions) as tested in accordance with A.S.T.M. Standard Test B-611, and (5)have a porosity of from about 8.0 to about 0.1 percent, as determined in accordance with A.S.T.M. Standard Test C-373-72 (water absorption). Furthermore, the sintered cylinders produced by the aforementioned treatment, when the sintering temperature is 1,680 degrees centigrade, and when the sintering time is 3.0 hours, will have a density of at least about 98.5 percent of theoretical (calculated) density. The density of said cylinders is determined in accordance with A.S.T.M. Standard Test C-20-63.

The process of applicants' invention produces a precursor which, after heat-treatment, produces the purified beta-sialon material. The beta-sialon phase in applicants' precursor material contains from about 35 to about 25 percent of silicon, from about 24 to about 33 percent of aluminum, from about 14 to about 20 percent of oxygen, and from about 27 to about 22 percent of nitrogen, all as determined by microprobe analysis. Conventional means of making such microprobe analysis are described in U.S. Pat. No. 5,030,600.

In one preferred embodiment, the beta-sialon phase in applicants' precursor material contains from about 33 to about 27 percent of silicon, from about 26 to about 31 percent of aluminum, from about 15 to about 19 percent of oxygen, and from about 26 to about 23 percent of nitrogen.

In an even more preferred embodiment, the beta-sialon phase in applicants' precursor material contains from about 31 to about 29 percent of silicon, from about 28 to about 29 percent of aluminum, from about 16 to about 18 percent of oxygen, and from about 25 to about 24 percent of nitrogen.

In the most preferred embodiment, the beta-sialon phase in applicants' precursor material contains about 29.7 percent of silicon, about 28.6 percent of aluminum, about 17.0 percent of oxygen, and about 24.7 percent of nitrogen.

THE PREFERRED PROCESS OF APPLICANTS' INVENTION

In the process of this invention, an "activated" set of reactants is preferably provided for a controlled combustion-synthesis reaction. The term "controlled combustion-synthesis" ("CCS") refers to a self-sustained, highly exothermic direct synthesis, often referred to as "SHDS," or "metal-lothermic reduction and synthesis," often referred to as "MTRS."

"SHDS," a self-sustained, highly exothermic process of direct synthesis from elements, is a self-propagating, high temperature form of controlled combustion-synthesis; it is a chemical process involving an exothermic reaction between a metal and a nonmetal powder mixture.

"MTRS," a metallo-thermic reduction and synthesis process involving thermite-type reactions, is another form of controlled combustion synthesis; it is a chemical process involving the reduction of oxides or other compounds of metals by igniting mixtures of these compounds with powdered metals, followed by in situ synthesis of new compounds using the energy released during the reduction sequence.

Both SHDS and MTRS reactions are surface-type reactions in which there is minimal diffusion of the reactants through the product layers during the high-temperature stage of the process. In order to maximize the yield obtained with these reactions, the amount of contact between the reagents has to be maximized.

One means of maximizing contact between the reagents is to increase the density of contact points (the number of contact points per unit volume). This may be achieved by intensive mechanical treatment of a specified powder mixture.

The contact points between the reagents should be intimate; there must be intimate contact as close as possible to the molecular level. Intensive mechanical treatment helps insure penetration of the reagent particles into each other's structure and increases the number of intimate contact points.

Mechanochemistry involves the relations between mechanical work and mass transformation. Comminution is an intensive process of this kind, which acts through impact, compression, and attrition—with inputs of kinetic energy, shear energy, strain energy, and thermal energy—and which converts the materials involved into highly activated powders capable of polymorphic transformation and/or chemical reaction, accompanied by energy dissipation. Intensive mechanical treatment of reaction mixtures yields a highly activated material. The overall free energy is increased by contributions from the surface energy, as the per-unit surface of the particulate system is increased under comminution. Furthermore, the overall free energy is also increased by contributions form the stored elastic strain energy, as the particles are deformed under the combination of the hydrostatic and shear components of the stress field.

Without wishing to be bound to any particular theory, it is believed that a stage in mechanochemistry is mechanochemical activation, which may be explained by the accumulation of internal energy in the ground material. On the submicroscopical scale, very high temperatures develop at the impact points between particles during the extremely brief impacts caused by the comminution treatment; as a result, "magma-plasma" pockets are formed which send fragments of material, ions, electrons, etc. to the surroundings. At the same time, on the microscopic scale, the whole lattice network of the particle is disturbed by elastic waves and the state of activation sets in. The excess free energy is associated with the lattice elastic strain through morphological defects, and also through increase of the surface energy of the system as particles are fragmented (a macroscopic-scale effect).

The mechanochemical treatment process may be used with many different reactions. It is discussed in detail below with regard to illustrate only several of such reactions.

In one embodiment, the mechanochemistry treatment is used to incorporate carbon and/or boron and/or silicon into a network of transition metal(s) prior to ignition of such metal(s) to form a carbide and/or boride and/or silicide. Thus, one may use the mechanochemical treatment to incorporate carbon and/or boron and/or silicon into one or more of titanium, vanadium, chromium, manganese, cobalt, nickel, zirconium, niobium, molybdenum, hafnium, tantalum, and tungsten. In this embodiment, the carbon is comminuted with one or more of such transition metals under ambient conditions until a substantially single-phase mixture is formed. Thereafter, the mixture thus formed is preferably pelletized and ignited.

By way of further illustration, one may use the mechanochemical treatment to incorporate aluminum into nickel, titanium, cobalt, or mixtures thereof. In this embodiment, the comminution of the materials is preferably conducted under a protective atmosphere (such as argon, krypton, and the like) until a substantially single-phase composition is formed. Thereafter, the pseudo-alloy formed is preferably pelletized and ignited under protective atmosphere.

By way of further illustration, one may incorporate gaseous nitrogen into a metal (such as aluminum, any or all of the aforementioned transition metals, and the like) to create nitrides. In this embodiment, the comminution of the materials is preferably conducted under nitrogen or a nitrogen-containing gas (such as ammonia) until a substantially single-phase material is produced. Thereafter, the nitrogen-containing material thus formed is preferably pelletized and ignited under a nitrogen or nitrogen-containing gas atmosphere.

By way of further illustration, one may incorporate hydrogen into one or more of the aforementioned transition metals and/or a rare earth metal (such as, e.g., lanthanum, cerium, praseodymium, neodymium, promethium, samarium, eropium, and gadolinium), to form a hydride. In this embodiment, the comminution is preferably conducted under hydrogen or a mixture of hydrogen and inert gas (such as argon) until a substantially single-phase composition is produced. Thereafter, the material thus formed is preferably pelletized and ignited under a hydrogen or hydrogen-containing gas atmosphere.

In another embodiment of the mechanochemistry process, an oxide is formed by a reaction in which oxygen is incorporated into a reactant by means of mechanochemistry.

By way of illustration, aluminates and/or magnesia alloys of rare earth metals may be prepared by initially comminuting a mixture of aluminum and/or magnesium and rare earth metal aluminum material under oxygen or oxygen-containing atmosphere (such as air, ozone, enriched oxygen-air mixtures, and the like) until a rare earth aluminum pseudo alloy material which consists essentially of a single phase is produced. Thereafter, this material may be pelletized and ignited under oxygen or oxygen-containing gas to form a rare earth aluminate and/or a magnesia rare earth oxide binary compound.

By way of further illustration, one may treat a mixture of bismuth and/or niobium one or more transition metals or alkali or alkaline earth metals (such as lithium, sodium, potassium, barium) by mechanochemistry to incorporate oxygen therein This mixture is comminuted under oxygen or oxygen-containing gas until it forms a substantially single-phase material, which is thereafter preferably pelletized and ignited under oxygen or oxygen-containing gas. In this embodiment, one may form bismuth oxide based binary compounds, niobates, etc.

One may form a ternary compound by using three metals with the transition metal and/or alkali metal and/or alkaline earth metal reagent. Thus, for example, one may mix bismuth with titanium and niobium and thereafter comminute this mixture under oxygen-containing atmosphere. By way of further illustration, one may comminute mixtures of bismuth, titanium, and tantalum, or bismuth, barium, and niobium, or bismuth, lead and tantalum, or niobium, sodium, and barium, or niobium, potassium, and barium, and the like.

In another embodiment of the mechanochemistry process, involving thermite types of composite materials, one may incorporate either aluminum and/or magnesium and/or calcium and/or lanthanum and/or lithium and/or barium into a transition metal oxide. This comminution is preferably conducted in the presence of carbon and/or nitrogen and/or silicon to form an oxide-nonoxide composite material which is substantially single phase. This composite material thereafter is preferably pelletized and ignited under ambient conditions, to form a composite material. By way of illustration, one may comminute titanium oxide with aluminum and carbon under nitrogen-containing gas, or one may comminute tantalum oxide, aluminum, and carbon under nitrogen-containing atmosphere, or one may commminute titanium oxide, silicon oxide, and aluminum material under inert atmosphere, and the like.

By way of further illustration, one may form superconductive material by the mechanochemistry process. In this process, one may incorporate one metal of the superconductor (such as silver, strontium, copper, zinc, or cadmium) into a peroxide of another metal of the superconductor (such as a peroxide of barium, calcium, strontium, lead, manganese, and copper) by comminuting such metal with such peroxide in the presence of a rare earth oxide (such as, e.g., yttria), under oxygen-containing gas, to form a ternary compound which is substantially single phase. This compound may thereafter be pelletized and ignited under oxygen-containing gas to form single-phase ternary compound, such as the well known yttrium—copper-barium 3:2:1 superconductive phase.

The high-temperature superconductors which may be produced by the mechanochemistry process are described in an article by A. W. Sleight entitled "Chemistry of High-Temperature Superconductors," Science, Volume 242 (Dec. 16, 1988) at pages 1519–1527.

One preferred class of superconductors, described on pages 1522–1523 of the Sleight article, is of the formula $R Ba_2Cu_3O_{6+x}$, wherein x is from about 0.5 to about 1.0 and R is a rare earth element selected from the group consisting of yttrium, gadolinium, lanthanum, europium, holmnium, and the like. In one preferred embodiment, R is yttrium.

Another preferred class of superconducting materials is of the formula $(AO)_mM_2Ca_{n-1})Cu_nO_{2n+2}$, wherein A selected from the group consisting of thallium, bismuth, and mixtures of bismuth and lead, m is from about 1 to about 2 (and generally is 1 or 2 when A is thallium and is 2 when A is bismuth), M is selected from the group consisting of barium and strontium, and n is at least 1. In one preferred embodiment, illustrated on page 1523 of the Sleight article, A is thallium, m is 2, M is barium, and n is 3; this composition has a critical temperature of about 122 degrees Kelvin.

In one preferred embodiment, the superconductor used in the invention of the formula $Y Ba_2Cu_3O_{7-x}$, the well known 1-2-3 high-temperature superconducting phase.

In one preferred embodiment of applicants' process, it is preferred to conduct the mechanochemical activation treatment while the sample is contacted with flowing nitrogen-containing gas at a flow rate of from about 0.1 to about 0.5 gallons per minute.

FIG. 1 illustrates one preferred embodiment of the process of this invention.

In the first step of the process of FIG. 1, an oxygen-deficient silica material is provided. The oxygen-deficient silica material may be provided by comminuting silica in nitrogen environment and/or under vacuum environment. This comminution may be conducted in any of the rotary mills or vibration mills described elsewhere in this specification until a single-phase silica material with an oxygen content of from about 44 to about 47 weight percent is obtained.

Thus, referring to FIG. 1, to mill 10 is charged the silica via line 12, surfactant via line 14, and either nitrogen-containing gas and/or a source of vacuum via line 16.

In one preferred embodiment, from about 0.1 to about 1.0 percent of surfactant, by total weight of silica and surfactant, is added to the mill 10 by line 14. As used in this specification, the term "surfactant" refers to a surface active agent, i.e., a substance that alters energy relationships at interfaces. It is preferred that the surfactant be a synthetic or natural organic compound which is liquid and which is preferably a nonionic surfactant. Some nonionic suitable surfactants are described in Funk U.S. Pat. No. 4,477,259, the disclosure of which is hereby incorporated by reference into this specification. Other nonionic surfactants are described and listed in McCutcheon's "Emulsifiers and Detergents," North American Edition (McCutcheon Division, MC Publishing Company, Glen Rock, N.J., 1981), the disclosure of which is hereby incorporated by reference into this specification.

In one embodiment, the surfactant used is anionic, and its solubilizing group(s) is preferably a carboxylate group. In another embodiment, the surfactant is cationic, and its solubilizing group(s) is selected from the group consisting of a primary amine group, a secondary amine group, a tertiary amine group, a quaternary ammonium group, and mixtures thereof.

In one preferred embodiment, the surfactant is a carboxylic acid containing from about 4 to about 26 carbon atoms. One preferred class of carboxylic acids is the saturated fatty acids containing from about 4 to about 26 carbon atoms. Another preferred class of carboxylic acids is the unsaturated fatty acids containing from about 4 to about 24 carbon atoms. The most preferred fatty acid is oleic acid.

In another embodiment, no surfactant is added to mill 10.

If a surfactant is added to mill 10, it is preferred to use a surfactant which will be volatilized at a temperature of 1,200 degrees centigrade. The use of such a surfactant guarantees that substantially no surfactant residue will be present in the sintered product.

Silica is added to the mill 10 via line 12. After the silica has been comminuted in mill 10, from about 30 to about 47 weight percent of such silica, by total weight of aluminum material, aluminum nitride, silicon nitride, surfactant, metal fluoride, and silica, is added to the second mill described below.

It is preferred that substantially all of the silica used in mill 10 be smaller than about 53 microns. In one embodiment, substantially all of the silica particles used in mill 10 are smaller than about 15 microns. One may use any commercially available silica with the correct particle size distribution.

The silica used in the process should be substantially dry, i.e., it should contain less than about 0.1 percent of moisture.

Referring again to FIG. 1, mill 10, which may be a high-speed rotary ball mill, is used to activate the silica. One may also use a vibratory ball mill to comminute and activate the mixture. Additionally, or alternatively, one may use comminution means such as jet mills, attrition mills, high speed hammer mills, and the like. These mills are described in U.S. Pat. No. 5,030,600.

In the process of this invention, when mill 10 is a vibratory ball mill, it is preferred to comminute silica in it for a period of at least about 8 hours and, more preferably, from about 8 to about 24 hours; in one preferred embodiment, the mixture is comminuted in the vibratory mill for from about 12 to about 18 hours.

High-intensity mill 10 may be a high-speed centrifugal mill. When high-intensity mill 10 is a centrifugal mill, it is preferred to operate it at a speed of at least 500 revolutions per minute for at least about 2 hours. In one embodiment, the mill is operated for from about 2 to about 6 hours at a speed of from about 550 to about 850 revolutions per minute. In another embodiment, the mixture is comminuted in the mill for from about 3 to about 4 hours.

When one uses either a high-speed ball mill or a vibratory mill in the process of this invention, a specified grinding media preferably should be used. The grinding media should have a density of at least about 6.0 grams per cubic centimeter. Thus, e.g., one may use zirconia media, stainless steel media, tungsten carbide media, and the like.

When a high-speed ball is used, the weight/weight ratio of grinding media/material to be ground should be at least about 6/1. With a vibratory ball mill, said weight/weight ratio should be at least about 8/1. The volume/volume ratio of the grinding media/material to be ground should be no more than about 3/1 in the ball mill and no more than about 4/1 in the vibratory mill.

The silica is comminuted in mill 10 until it preferably has an oxygen content of from about 44 to about 47 weight percent. Samples of the silica may be periodically removed via line 18 to laboratory 20, wherein such silica may be subjected to conventional elemental analysis. Thus, for example, one may use an oxygen determinator, such ar model no. RO-416DR sold by Leco Corporation of 300 Lakeview Avenue, Saint Joseph, Mich. 49085-2396, to conduct such oxygen analysis. Alternatively, or additionally, one may use conventional spectral analysis.

The comminuted silica, with the desired oxygen-content, may be discharged via line 22 to mill 24, which mill 24 will be used to comminute the silica, aluminum, aluminum nitride, silicon nitride, and metal fluoride. This mill 24 can be a centrifugal mill, a vibratory mill, a planetary mill, or any of the mills described above. In one embodiment, the same type of mill is used for both mill 10 and mill 24.

Into high-intensity mill 24 is charged nitrogen-containing gas via line 26, aluminum material via line 28, silicon nitride via line 29, aluminum nitride via line 30, and metal fluoride via line 32. The mill 24 is then operated until the mixture is substantially single phase and the nitrogen content of the mixture has increased at least about 2.0 weight percent.

The reaction mixture is comminuted until analysis reveals that it is comprised of substantially a single phase material, as shown by scanning electron microscopy. A sample of the reaction mixture in mill 24 may be periodically removed via line 33 to laboratory 34 wherein it may be subjected to analysis by a scanning electron microscope to determine whether it consists essentially of only one phase. See, e.g., FIGS. 5-11 to 5-13 of applicant George Hida's thesis, at page 79, wherein substantially single phase compositions are illustrated.

The reaction mixture is also comminuted until analysis in laboratory 34 reveals that the nitrogen content of the mixture has increased at least about 2.0 weight percent over the nitrogen-content of the starting mixture.

When mill 24 is a centrifugal mill, at least about 2 hours of comminution at a rate of at least 500 revolutions per minute is usually required to form a one-phase material. When mill 24 is a vibratory mill, at least about 6 hours of comminution is generally required to form a one-phase material.

The nitrogen-containing gas used in the process may be either pure nitrogen, a mixture of nitrogen and inert gas, a mixture of nitrogen and hydrogen, nitrogen-compounds in gaseous form (such as ammonia), and the like. As will be recognized by those skilled in the art, any material which is in gaseous state at the conditions used for the comminution (which may, e.g., be conducted under elevated temperature), and which will furnish combined or uncombined nitrogen to the material being comminuted, may also be used.

It is preferred that the nitrogen-containing gas be comprised of at least 90 volume percent of combined and/or uncombined nitrogen. It is more preferred that the nitrogen-containing gas consist essentially of nitrogen.

The aluminum material used in the process may be either pure aluminum, aluminum alloy, or mixtures thereof. Suitable aluminum alloys include, for example, alloys of aluminum with lithium, silicon, magnesium, and the like.

In one preferred embodiment, the aluminum material is aluminum. This aluminum is charged to high intensity mill 24 via line 28. The aluminum used in this process is preferably a powder which contains less than about 1.0 percent, by weight, of combined oxygen. As used in this specification, the term "combined oxygen" refers to oxygen which is combined with aluminum and, usually, is in the form of a metal oxide. The amount of combined oxygen may be determined by evaluating the total oxygen present by conventional means such as, e.g., spectral analysis.

The aluminum or aluminum alloy should be in powder form and will preferably have a specific surface area of from about 0.2 to about 1.1 square meters per gram.

In one embodiment, the aluminum material used is in the form of fine aluminum flakes.

In the aluminum material used in the process of this invention, the specified weight ratio is based upon the concentration of pure aluminum. When an aluminum alloy material is used, or when a mixture of aluminum or aluminum alloy material is used, the aluminum content of the alloy is first calculated, and this aluminum content is then used to determine the aluminum content of the material.

The particle size distribution of the aluminum material will preferably range from about 4 to about 28 microns and, more preferably, from about 6 to about 12 microns; substantially 100 percent of the aluminum particles will be within the specified size range. In one preferred embodiment, at least about 80 weight percent of the aluminum particles are between from about 6 to about 12 microns in size.

Particle size analysis may be conducted by means well known to those skilled in the art. Thus, e.g., one can use the procedures described on pages 8-2 to 8-8 of Perry and Chilton's "Chemical Engineers' Handbook," Fifth Edition (McGraw-Hill Book Company, New York, 1973).

The aluminum material used in the process is preferably substantially dry, i.e., it contains less than about 0.1 percent, by weight, of moisture.

From about 23 to about 35 percent of the aluminum material, by total weight of aluminum material, aluminum nitride, silicon nitride, surfactant, comminuted silica, and metal fluoride, is charged to the mill 24 via line 28.

Aluminum nitride may, but need not be, used in the process of the invention. When it is used, aluminum nitride is charged to the mill 24 via line 30. Aluminum nitride is a relatively new material whose properties are described, e.g., on pages 25–27 of the May, 1989 issue of "Ceramic Industry" (Corcoran Communications Inc., Solon, Ohio).

From about 0 to about 8 weight percent of the aluminum nitride, by total weight of the aluminum, aluminum nitride, silicon nitride, surfactant, oxygen-deficient silica, and metal fluoride, is fed to mill 24 via line 30.

One may use commercially available aluminum nitride products. Thus, e.g., one may use the high density aluminum nitride available from ICD Group, Inc. (641 Lexington Avenue, New York, N.Y.), product no. 06 26 561000 available from Hermann C. Starck, Inc. (280 Park Avenue, New York, N.Y.), Aldrich product number 24,193-0, and the like.

The aluminum nitride which may be used in the process of this invention preferably contains less than about 2.0 weight percent of combined oxygen, has substantially all of its particles smaller than about 325 mesh (53 microns), and is substantially dry, containing less than about 0.1 percent of moisture. The reaction mixture comprised of the aluminum nitride also should be substantially dry; if it is not, aluminum nitride will hydrolyze to ammonia and aluminum hydroxide or aluminum oxo-hydroxide.

Silicon nitride may be, but need not be, used in the process of the invention. When it is used, such silicon nitride is added to mill 24 via line 29. The silicon nitride used in the process preferably has a nitrogen content of at least about 35 weight percent, an oxygen content of less than about 2.0 weight percent, a free silicon content of less than 1.0 weight percent, a particle size such that substantially all of its particles are smaller than about 10 microns, and a purity of at least 99.5 percent.

From about 0 to about 25 weight percent (by total weight of all material charged to mill 24) of silicon nitride is charged via line 29.

In one embodiment, neither silicon nitride nor aluminum nitride is used in the process. In another embodiment, only silicon nitride is used. In another embodiment, only aluminum nitride is used. In yet another embodiment, both of such nitrides are used. In this last embodiment, it is preferred that the weight of the silicon nitride added to mill 24 be from about 3.0 to about 4.0 times the weight of the aluminum nitride charged to mill 24. It is even more preferred that the weight/weight ratio of silicon nitride/aluminum nitride charged to mill 24 be from about 3.2 to about 3.7. In an even more preferred embodiment, said weight/weight ratio is from about 3.3 to about 3.5.

In one preferred embodiment, from about 0.1 to about 1.0 percent of surfactant, by total weight of aluminum material, silicon nitride, aluminum nitride, surfactant, metal fluoride, and silica, is added to the mill 24 by line 31. One may use the same surfactant as described above for use with the comminution of the silica. Alternatively, or additionally, one may use different surfactant.

Oxygen-deficient silica is added to the mill 24 via line 22. From about 30 to about 47 weight percent of such silica, by total weight of aluminum material, silicon nitride, aluminum nitride, surfactant, metal fluoride, and such silica, is added to mill 24.

A fluoride compound may, but need not be, used in the process. From about 0 to about 5 weight percent (by total weight of aluminum material, aluminum nitride, silicon nitride, oxygen-deficient silica, surfactant, and fluoride compound) of a fluoride compound is charged to mill 24 via line 32. This fluoride compound is preferably a metal fluoride which is selected from the group consisting of sodium fluoride, sodium hydrogen fluoride, potassium fluoride, potassium hydrogen fluoride, lithium fluoride, hydrogen fluoride, potassium tetrafluoroaluminate, aluminum fluoride, potassium hexafluoroaluminate, sodium tetrafluoroaluminate, sodium hexafluoroaluminate, and mixtures thereof. The preferred fluoride compound is sodium fluoride.

The fluoride compound which may be used in the process is preferably anhydrous. The term anhydrous, as used in this specification, refers to an inorganic compound that does not contain water either adsorbed on its surface or combined as water of crystallization.

The fluoride compounds which are commercially available may be used. Thus, by way of illustration and not limitation, and referring to the 1991-1992 Aldrich Catalog (Aldrich Chemical Company, Inc., 940 West Saint Paul Avenue, Milwaukee, Wis.), one may use reagent 21,538-4 (potassium fluoride anhydrous), reagent 21,115-4 (sodium fluoride), and the like.

It is preferred that all of the fluoride compound particles be less than about 100 mesh (150 microns).

After the aluminum material, the aluminum nitride, the silicon nitride, the surfactant, the fluoride compound, and the silica have been charged to mill 24, the reaction mixture is milled under nitrogen-containing gas until a substantially single phase composition has been produced. Samples of the mixture may be periodically withdrawn from the mill 24 via line 33 and subjected to analysis in laboratory 34.

Once a substantially one-phase material has been formed in mill 24, the reaction mixture is discharged via line 36; thereafter, in one embodiment (illustrated in FIG. 1), it is pelletized in pelletizer 38 prior to the time it is ignited.

In one preferred embodiment, the material discharged via line 36 is pelletized in pelletizer 38 by pressing it into small pellets whose minimum size is at least about 1.0 inches. The pellets may be in the shape of a cylinder, a bar, etc. The pressure used in the pelletizing should be sufficient to confer enough strength to the pellets so that they can be handled without disintegrating. However, the porosity of the pellets should be at least about 40 percent.

It is preferred to press the pellets at a pressure of at least about 100 pounds per square inch.

Any conventional press may be used to pelletize the powder from mill 24. Thus, e.g., one may use a hydraulic press. In one embodiment, a hydraulic press is used which is comprised of hydraulic pumps which are connected to plungers.

The pressed pellets may then be discharged via line 40 to reactor 42, in which they are ignited. Nitrogen-containing gas may be flowed into the reactor prior to and during ignition; alternatively, an air environment may be used during ignition and combustion.

In one embodiment, the pellets from line 40 are self ignited in reactor 42. The material to be ignited is placed in reactor 42 and is heated to a temperature of about 760 degrees centigrade until ignition occurs. Thus, e.g., the material to be ignited can be charged to a graphite boat, and the graphite boat assembly can be inserted into the reactor and heated until ignition occurs. In one aspect of this embodiment, the material from line 36 may be formed into a shaped body and heated to cause it to reaction sinter, thereby simultaneously forming the shaped body.

In another embodiment, the pellets are ignited by contacting them with a source of heat at a temperature of at least about 800 degrees centigrade such as, e.g., a torch, a hot wire, a spark, a laser beam. etc.

The combusted material is then allowed to cool to ambient temperature. In one embodiment, the ignited material is discharged to a refractory tray, wherein it is allowed to cool to ambient.

The cooled, combusted material then is crushed; thus, referring again to FIG. 1, the cooled, combusted material may be passed via line 44 to crusher 46. In one embodiment, cooled, reacted pellets are crushed, preferably in a roller mill. The pellets are crushed so that substantially all of their particles are within the range of about 0.1 to about 0.5 millimeters. Any suitable roll crusher may be used. Thus, e.g., one may use a roll crusher having smooth rolls. Medium-peripheral speed mills (such as ring-roll mills, bowl mills, roll mills, etc.) may be used; see, e.g., pages 8–22 of said Perry and Chilton's book. The rolls in the crusher preferably are smooth.

Referring to FIG. 1, the crushed material may be discharged via line 48. Thereafter, it may either be used as is or subject to further size reduction in siever 50.

The crushed matter from line 48 consists essentially of least about 16 weight percent of material of the formula $Si_{6-z}Al_zO_zN_{8-z}$, from about 54 to about 28 weight percent of alumina, from about 0 to about 8 weight percent of aluminum nitride, from about 0 to about 25 weight percent of silicon nitride, and from about 30 to about 24 weight percent of free silicon.

The crushed matter is a precursor material which may be used to create a sialon bond phase through reaction bonding for oxide and nonoxide refractory materials.

The silicon material in the precursor material may be in the form of powder and/or whiskers. In general, the use of relatively short comminution times and self-ignition of powder will tend to produce silicon in the powder form. On the other hand, the use of relatively long comminution times and the ignition of pellets will tend to produce silicon whiskers.

As used in this specification, the term "whisker" refers to a needle-like, single crystal. This term is discussed in U.S. Pat. No. 4,990,295, the disclosure of which is hereby incorporated by reference into this specification.

In one embodiment, at least about 90 weight percent of the silicon material is in whisker form. If one desires powdered silicon, he may either modify the comminution time and/or the ignition mode, and/or he may mill the composite material to destroy the whiskers.

The silicon whisker produced in applicants' process generally has a diameter of from about 3 to about 7 microns and a length of from about 50 to about 300 microns. It consists essentially of silicon.

The density of the silicon whiskers is about 2.3 grams per cubic centimeter, which is substantially lower than the density of the alumina. Thus, it is relatively easy to separate the silicon whiskers from alumina by standard flotation processes.

The precursor material of this invention may be used to create a bond phase by mixing it with oxide or nonoxide refractory material and, thereafter, heating the mixture to a temperature of at least about 1250 degrees Centigrade while blanketing the material with nitrogen-containing gas.

The precursor material of this invention is a highly activated silicon/alumina composite powder material suitable for fast oxynitride bonding of refractory oxides, carbides, and nitrides. Thus, one may use it together with such inorganic materials as silicon carbide, silicon nitride, titanium nitride, boron nitride, and the like.

In general, in order to cause the reaction bonding to occur, one should preferably mix at least about 5 weight percent (and, preferably, from about 5 to about 30 weight percent) of the precursor material with the oxide or nonoxide refractory material. The oxide or nonoxide refractory may be in the form of powder and/or whiskers. Furthermore, in applicants' precursor, the silicon may be in the form of powder and/or whiskers.

Instead of using silicon to produce silicon nitride reaction bonded silicon carbides, one may use applicants' precursor material. Because, in this precursor, the silicon part of the composite has a high nitrogen sorption potential at elevated temperatures, high bond rates are obtained with no free silicon left in the product; and the bond phase created is a sialon material (instead of silicon nitride). The bonded refractory material produced by applicants' process exhibits improved corrosion resistance when immersed in certain molten metals, and improved resistance to chemical attack.

By way of further illustration, one may add from about 5 to about 30 weight percent of such precursor material to silicon nitride powders and thereafter heat the mixture under nitrogen to cause reaction bonding to occur.

By way of further illustration, one may add from about 8 to about 30 weight percent of said precursor material to refractory grade silicon carbide powder, form such mixture into a into a desired shape, and heat the green shape under nitrogen atmosphere. In another embodiment, the precursor material is mixed with boron carbide powder. In yet another embodiment, the refractory material used is boron nitride.

In general, in order to form a reaction-bonded product between the precursor material and the ceramic material, the two materials are mixed (preferably wet-mixed in a slurry), dried (if necessary), formed into a green shape, and then heated while under nitrogen-containing gas (such as nitrogen) to a temperature sufficient to transform the precursor into a sialon phase. In general, the temperature used will be form about 1,450 to about 1,650 degrees Centigrade.

Size reduction of the precursor material

In one preferred embodiment, the crushed material from line 42 is passed via line 49 to mill 51, wherein it is milled until at least about 95 percent of its particles are smaller than 325 mesh (53 microns). In one aspect of this embodiment, the crushed material from line 49 is passed to ball mill 51 where it is milled in two stages. In the first stage of this embodiment, the material is milled until substantially all of its particles are smaller than about 150 microns (100 mesh). Thereafter, the −100 mesh material is preferably mixed with from 0.1 to about 1.0 weight percent of surfactant (such as the unsaturated fatty acid[s] described elsewhere in this specification) which may be charged via line 53, and this mixture is then further milled until at least about 95 percent of the material passes 325 mesh (and is less than 53 microns). Samples of the mixture may periodically be removed from mill 51 via line 46 to laboratory 57, wherein sieve analysis of the material may be conducted. In determining how much material tested in laboratory 57 is smaller than 53 microns, water at a pressure of from about 5 to about 15 pounds per square inch is used to attempt to force the particles through the 325 mesh sieve.

In another embodiment, the crushed material from crusher 46 is passed via line 48 to a two-deck vibratory sieve 50. This vibratory sieve preferably has at least two sieves which sequentially screen (and/or treat) the crushed material.

The first screen in the vibratory sieve, into which the crushed material is first discharged, is 150 mesh. Material which passes through this sieve is then passed to the second vibratory sieve, which is 325 mesh.

Heat treatment of the sieved, precursor material

In one preferred embodiment, the novel precursor material of this invention, which preferably has been sieved as described above, is heat-treated. Precursor material may be passed via line 59 and/or 61 and/or 63 to furnace 52, in which the material may be heat-treated.

Applicants have discovered that, when the crude combusted material described above is treated in accordance with a certain heat cycle, a beta-sialon product which contains no silicon nitride and no free silicon is produced.

It is well known that, at temperatures exceeding 1,000 degrees centigrade, silicon reacts in the presence of nitrogen to form silicon nitride. The reaction is exothermic and is used by many in the field to produce both silicon nitride and beta-sialon solid solutions containing silicon nitride. Thus, for example, U.S. Pat. No. 4,243,621 of Mori et al. discloses a process which produces an intermediate product which contains beta-sialon and free silicon (see column 10). Mori et al. heat this intermediate product at a temperature in excess of 1,000 degrees centigrade under nitrogen atmosphere in order to transform the free silicon to beta-silicon nitride. They teach that the silicon in the intermediate is highly active and may thus be readily nitrided to form the beta-silicon nitride.

In applicants' heat-treatment process, it is preferred to use impure, intermediate product in which substantially all of the particles are smaller than 325 mesh (53 microns). Thus, for example, the material from siever 50 which passes through the 325 mesh may be passed via line 59 to furnace 52.

It is preferred to conduct the thermal conditioning treatment in a high-temperature furnace able to reach a temperature in excess of 1,600 degrees centigrade. Such furnaces are well known to those in the art and are described, e.g., on pages 606–612 of Volume 5 of the McGraw-Hill Encyclopedia of Science & Technology.

In one preferred embodiment, the furnace 52 is a graphite furnace containing a graphite heating element; and the thermal conditioning treatment is conducted under nitrogen atmosphere. Such a furnace, e.g., is the graphite element furnace available as model number 1000-45120-FP30 from Thermal Technology, Inc., Astro Division, of Santa Barbara, Calif.

In another embodiment, the furnace 52 is a rotary furnace. Thus, e.g., one may use a rotary furnace obtainable from Advanced Vacuum Systems of Ayer, Mass. 01432.

Referring to FIG. 1, the sieved material may be passed via line 59 to furnace 52. A nitrogen source 65 supplies a nitrogen or nitrogen-containing atmosphere via line 67 to the furnace after the material has been loaded into the furnace.

The sieved material may be placed into a refractory container prior to being placed into the furnace; the use of such a container will prevent the material from being contaminated by carbon from the graphite heating element. It is preferred that such container substantially encapsulate the sieved material.

In one embodiment, the refractory container is a high-temperature furnace tube which is obtainable from, e.g., the McDanel Refractory Company of Beaver Falls, Pa. The material is charged into such a tube, the tube is then placed into the furnace, and nitrogen is caused to flow from one end of the tube to another through the material.

Once the sieved material is in the furnace, the furnace door is closed, and the furnace is purged with nitrogen or nitrogen-containing gas. Thereafter, the temperature of the furnace is raised from ambient to a temperature of from about 800 to about 1,000 degrees centigrade. It is preferred to raise the temperature from ambient to from about 850 to about 950 degrees centigrade. It is even more preferred to use a temperature of about 900 degrees centigrade.

It is preferred to raise the temperature of the furnace from ambient at a rate of from about 5 to about 15 degrees per minute and, preferably, from about 8 to about 12 degrees per minute. It is most preferred to use a rate of about 10 degrees per minute.

Nitrogen or nitrogen-containing gas is flowed over the sieved material as its temperature is being raised. It is preferred to use a sufficient amount of nitrogen gas so that it flows through the sieved material at a rate of from about 4 to about 10 liters per minute and exerts a pressure upon said material of at least 2 pounds per square inch gravity. It is preferred that the gas flow rate be such that the gas exerts a pressure upon such material of from about 2 to about 7 pounds per square inch gravity.

Once the sieved material has reached the temperature of from about 800 to about 1,000 degrees centigrade, it is maintained at this temperature for from about 15 to about 60 minutes while it is contacted with a sufficient amount of nitrogen so that the nitrogen gas flows through the material at a flow rate of from about 4 to about 10 liters per minute and exerts a pressure upon said material of at least about 2 p.s.i.g. It is preferred that the gas exert a pressure upon said material of from 2–7 p.s.i.g.

After this initial heat treatment, the temperature of furnace is then raised to from about 1240 to about 1260 degrees centigrade at a rate of from about 5 to about 15 degrees per minute. It is preferred to raise the temperature to 1,250 degrees centigrade at a rate of about 8 to about 12 degrees per minute. During this temperature increase, the sieved material is contacted with a sufficient amount of nitrogen or nitrogen-containing gas so that the gas flows through the material at a flow rate of from about 1 to about 4 liters per minute and exerts a pressure upon said material of at least about 14 (and preferably from about 14 to about 16) p.s.i.g.

Once the material has reached the temperature of from about 1240 to about 1260 degrees centigrade, it is maintained at this temperature for at least about 30 (and preferably from about 30 to about 90) minutes while being contacted with a sufficient amount of nitrogen so that the gas exerts a pressure upon said material of at least about 14 p.s.i.g. (and, preferably, from about 14 to about 16 p.s.i.g); in one embodiment, the material is maintained at the desired temperature for from about 45 to about 75 minutes. During this time, the nitrogen or nitrogen-containing gas flow rate is preferably less than about 1 liter per minute, preferably being substantially 0 liters per minute.

After the material has been maintained at 1240–1260 degrees centigrade for at least 30 minutes, its temperature is then raised to from about 1400 to about 1500 degrees centigrade at a rate of from about 5 to about 15 degrees per minute while being contacted with a sufficient amount of nitrogen or nitrogen-containing gas so that the nitrogen gas flows through the material at a flow rate of from about 1 to about 4 liters per minute and exerts a pressure upon said material of at least about 14 p.s.i.g. (and, preferably, from about 14 to about 16 pounds per square inch gravity). It is preferred to raise the temperature of the material to from about 1430 to about 1470 degrees centigrade. It is even more preferred to raise the temperature of the material to about 1450 degrees centigrade.

Once the material has reached the temperature of 1400–1500 degrees centigrade, it is maintained at such temperature for at least about 30 minutes (and, preferably, from about 30 to about 90 minutes while) being contacted with a sufficient amount of nitrogen or nitrogen-containing gas so that the nitrogen gas flows through the material at a flow rate of at least about 1 liter per minute and exerts a pressure upon said material of at least about 14 p.s.i.g.

Thereafter, the material is cooled to a temperature of from about 1000 to about 800 degrees centigrade while being contacted with a sufficient amount of nitrogen gas so that the nitrogen gas flows through the material at a flow rate of at least about 1 liter per minute and exerts a pressure upon said material of at least about 14 p.s.i.g.; the rate of cooling is from about 5 to about 15 degrees per minute and, preferably, is from about 8 to about 12 degrees per minute.

Once the material has been cooled to a temperature of from about 1,000 to about 800 degrees centigrade, it is then allowed to cool to ambient without any external cooling means; however, during this cooling, it is still maintained under a sufficient amount of nitrogen gas so that the nitrogen flows through the material at a flow rate of from at least about 1 liter per minute and exerts a pressure upon said material of at least about 2 pounds per square inch.

This heat treatment process unexpectedly produces a beta-sialon composition which contains no silicon nitride and no free silicon.

The heat-treated material may be discharged from furnace 52 and passed via line 54 to crusher 56, wherein it may be crushed so that substantially all of its particles are smaller than 325 mesh. Thereafter, the crushed powder may be passed via lie 58 to siever 60, which may be similar to siever 50. The material which passes through the bottom of siever 60 will have all of its particles smaller than 53 microns.

Referring again to FIG. 1, material which is discharged from siever 60, via line 62, generally contains at least 73 weight percent of the beta-sialon of the formula $Si_{6-z}Al_zO_zN_{8-z}$. In one preferred embodiment, the material contains at least about 82 weight percent of such beta-sialon. In an even more preferred embodiment, the material comprises at least about 89 weight percent of such beta-sialon. In yet another embodiment, the material contains at least 95 weight percent of such beta-sialon. In the most preferred embodiment, the material is comprised of at least about 99 weight percent of such beta-sialon.

The material which is discharged from siever 60 preferably has a particle size distribution such that at least 90 weight percent of its particles are smaller than 53 microns, at least about 50 percent of its particles are smaller than 25 microns, and at least about 10 percent of its particles are smaller than 15 microns. This material preferably has a specific surface area of at least about 0.8 square meters per gram.

The material which is discharged from siever 60 may then be passed via line 62 to mill 64, in which its particles may be deagglomerated. Milling will occur in mill 64 until analysis reveals that at least about 90 percent of the particles are smaller than 5.0 microns, at least 50 percent of the particles are smaller than 3.0 microns, and at least 10 percent of the particles are smaller than 2.0 microns; particles of the material to be milled may periodically be withdrawn via line 66 to laboratory 68, wherein it can be subjected to particle size analysis. This milling preferably occurs in the presence of either silicon nitride and/or sialon grinding media, although other grinding media may be used.

The specific surface area of the deagglomerated particles milled in mill 64 should be at least 3.0 square meters per gram. It is preferred that the material in mill 64 be wet milled.

In one embodiment, the particles are wet milled in the presence of isopropyl alcohol; in this embodiment, the specific surface area of the milled material is at least about 3.0 square meters per gram. In another embodiment, which is preferred, the milling occurs in an aqueous slurry, such as a water slurry; in this embodiment, the specific surface area is at least about 5.0 square meters per gram and often is at least about 7 square meters per gram.

Applicants do not know why specific surface area of the milled material is substantially higher when aqueous media is used. However, they have repeatedly observed that the wet grinding of their beta-sialon material in aqueous media enhances the specific surface area of their product, thus producing a more sinterble material.

In another embodiment, illustrated in FIG. 1 the material from mill 64, which preferably in aqueous media, is discharged via line 70 to attritor 72, wherein it is further milled until it has a specific surface area of at least about 12 square meters per gram and particle size distribution such that at least about 90 weight percent of its particles are smaller than 1.0 micron and at least about 50 weight percent of its particles are smaller than about 0.5 microns.

In one preferred embodiment, attritor 72 is a batch attritor such as, e.g., the heavy-duty 0-1 Batch Attritor produced by the Union Process Company of 1925 Akron-Peninsula Road, Akron, Ohio.

In one embodiment of the grinding process, the aqueous media used is water, such as, e.g., deionized water. Thus, for example, one may charge to attritor 72 eighty volume percent of grinding media, about 10 volume percent of the beta-sialon material, and about 10 volume percent of deionized water.

The material from mill 64 and/or attritor 72 may then be passed to drier 74, via line 76 or 78. The material in drier 74 is dried to a moisture content of less than 2.0 percent.

Any of the driers known to those skilled in the art may be used as drier 74. Thus, for example, one may use the driers described on pages 20-3 to 20-64 of said "Chemical Engineers Handbook," supra.

In one preferred embodiment, drier 74 is a spray drier. As is known to those skilled in the art, spray drying is accomplished by atomizing feed liquid into a drying chamber where the small droplets are subjected to a stream of hot air and are converted to powder particles.

One preferred spray drier which may be used is the model "Type HT" spray drier which is sold by Niro Atomizer Inc. of 9165 Rumsey Road, Columbia, Md. 21045.

Preparation of a reinforced, beta-sialon body

The aforementioned beta-sialon material may be reinforced with oxide material and/or nonoxide material such as, for example, aluminum oxide material, silicon carbide material, boron carbide material, boron nitride material, aluminum nitride material, titanium diboride material, and mixtures thereof. In one preferred embodiment, a reinforced sialon material is produced by a process in which a beta-sialon powder (all of whose particles are preferably smaller than about 5 microns) is wet milled with reinforcing agent, and the slurry thus produced is then formed into a green body and dried. In this embodiment, the materials may be milled in aqueous media (such as water), nonaqueous media (such as isopropyl alcohol), and the like.

By way of illustration, the beta-sialon material may be reinforced with aluminum oxide which is either in powder and/or whisker and/or short fibrous form. In this embodiment, it is preferred to use at least 10 volume percent (and, more preferably, at least 20 volume percent) of the alumina material.

By way of further illustration, the beta-sialon material may be reinforced with silicon carbide which is either in powder and/or whisker and/or short fibrous form. In this embodiment, it is preferred to use from about 10 to about 50 volume percent of the silicon carbide material. In one aspect of this embodiment, 20 volume percent of the silicon carbide material is used. In another aspect of this embodiment, 40 volume percent of the silicon carbide material is used.

By way of further illustration, the beta-sialon material may be reinforced with boron carbide material, which preferably is in powder form. In this embodiment, it is preferred to use at least 10 volume percent of the boron carbide material.

By way of further illustration, the beta-sialon material may be reinforced boron nitride material, which preferably is in powder form. In this embodiment, it is preferred to use at least 10 volume percent of the boron nitride material.

By way of further illustration, the beta-sialon material may be reinforced with aluminum nitride material, which is either in powder and/or whisker form. In this embodiment, it is preferred to use at least 10 volume percent of the aluminum nitride material.

By way of further illustration, the beta-sialon material may be reinforced with titanium diboride, which preferably is in powder form. In this embodiment, it is preferred to use at least 10 volume percent of the titanium diboride material.

Mixtures of the aforementioned reinforcing agents may be used. In general, it is preferred to wet-mix the reinforcing agent and the beta-sialon in the presence of aqueous media. However, when the reinforcing agent is degraded by aqueous media (as is, e.g., aluminum nitride), then a nonaqueous media (such as isopropyl alcohol) may be used.

Preparation of a green body

The material made in applicant's process may be used to prepare a green body. Thus, e.g., one may use the crushed material discharged via line 58. Alternatively, or additionally, one may use the ground material prepared in mill 64, 95 percent of which is smaller than 5 microns. Thus, one may prepare a material with other particle size(s) for use in the green body.

The green body preferably contains at least one material selected from the group consisting of binders, lubricants, and mixtures thereof. Typical binders and lubricants which may be used include unsaturated fatty acids (such as, e.g., stearic or oleic acid), organic materials, starches, gums, waxes, dextrine, corn flower, polyvinyl alcohol, marine derivatives, lignin extracts, methyl cellulose, and the like. It is preferred that the binder and/or lubricant used burn out of the ceramic body at temperatures below 400 degrees centigrade so that they will not interfere with ceramic reactions which occur at higher temperatures.

When a binder is used, it preferably is organic. Preferred organic binders include natural gums (such as xanthan gum, gum arabic, and the like), polysaccharides (such as refined starch, dextrine, and the like), lignin extracts (such as paper liquor), refined alginate (such as sodium or ammonium alginate), cellulose ethers (such as methyl cellulose, hydroxyethyl cellulose, sodium carboxymethyl cellulose, and the like), polymerized alcohols (such as polyvinyl alcohol), other vinyl binders (such as polyvinyl acetate, polyacrylamide, polyvinyl pyrolidone, and the like), polymerized butyral (such as polyvinyl butyral), acrylic resins (such as polymethyl methacrylate), glycols (such as polethylene glycol), waxes (such as paraffin, bee's wax, wax emulsions, microcrystalline wax, and the like), and the like.

One preferred class of binders are the vinyl binders which are soluble in water. These binders are preferably selected from the group consisting of polyvinyl acetate, polyvinyl alcohol, polacrylamide, polvinyl pyrolidone, and mixtures thereof.

In one preferred embodiment, the aforementioned composition is ground until at least about 95 weight percent of its particles are smaller than about 5 microns, and from about 75 to about 92 weight parts of the ground material is mixed with from about 25 to about 8 parts of a water based solution (at a concentration of from 3 to 8 weight percent) of polyvinyl alcohol. In this embodiment, the polyvinyl alcohol is preferably in the form of an aqueous solution containing less than about 20 weight percent of the active ingredient (polyvinyl alcohol) and water.

Another preferred class of binders are the waxes. Common waxes used as film-type binders are paraffin derived from petroleum, candelella and carnuba waxes derived from plants, and beeswax of insect origin. Paraffins are mixtures of straight-chain saturated hydrocarbons which tend to crystallize as plates or needles. Microcrystalline waxes are branched chain saturated hydrocarbons also derived from petroleum. The plant waxes are more complex mixtures of straight chain hydrocarbons, esters, acids, and alcohols that are relatively hard and have a relatively hard melting point of 85-90 degrees centigrade.

In one embodiment, at least one of the additives used in the green body is a lubricant. As is known to those skilled in the art, lubricants are materials which facilitate the flow of nonplastic, or poorly plastic, materials in the formation of dense compacts; and they are especially useful in dry pressing.

Forming a green body by injection molding

In one preferred embodiment, a green body is formed by an injection molding process. In this process, it is preferred to mix from about 75 to about 92 parts of applicants' composition, with a particle size such that at least about 95 percent of its particles are smaller than 5 microns, with from about 25 to about 8 parts of thermoplastic binder.

The injection molding process is well known to those skilled in the art and is described, e.g., on pages 590 to 592 of Brage Golding's "Polymers and Resins" (D. Van Nostrand Company, Inc., Princeton, N.J., 1959. Injection molding of ceramic materials is described on pages 373 to 377 of James S. Reed's "Introduction to the Principles of Ceramic Processing" (John Wiley & Sons, New York, 1988).

In this embodiment, in addition to using thermoplastic binder, one may also mix applicants' composition with a surfactant such as, e.g., oleic acid. In general, from about 75 to about 92 percent of the composition is dispersed in from about 8 to about 25 percent of the binder. Thereafter, the mixture is injection molded into a green body at a preferred pressure of from about 4 to about 8 atmospheres.

Forming a green body by other means

Applicants' composition may be mixed with one or more of said binders and/or lubricants and formed into green bodies by conventional means. Thus, by way of illustration, one may dry press the mixture at a pressure of from between about 35 to about 200 megapascals, one may use hot pressing, one may use isostatic pressing, and one may use any of the conventional means known to those skilled in the ceramic art for forming green bodies from powder mixtures.

In one preferred embodiment, the binder used in the mixture to be pressed is a polyvinyl alcohol aqueous solution which contains no more than about 8 percent, by weight of solution, of polyvinyl alcohol. From about 8 to about 25 parts, by weight, of this solution are preferably mixed with from about 75 to about 82 parts of applicant's composition, preferably with a composition which contains particles at least about 95 percent of which are smaller than 53 microns.

Drying/Debindering the green body

After the green body comprised of applicant's composition has been formed, it is preferred to subject it to conditions to insure that it has substantially no moisture and substantially no organic matter in it prior to the time it densified.

The green body will preferably be densified by heating it to a temperature of from about 1,650 to about 1,700 degrees centigrade, preferably for from about 1 to about 4 hours. It is preferred that, prior to densification, the green body contain less than about 0.1 percent of moisture. Thus, one may dry the green body by conventional means until it has the desired moisture content.

As is known to those skilled in the art, the temperature and time required for drying will vary with conditions such as, e.g., the thickness of the green body, the humidity, the air velocity, etc. By way of illustration, in one preferred embodiment, in which the green body contains about 8 parts by weight of a 5.0 percent solution of polyvinyl alcohol, the green body is dried at the rate of about 0.5 inch per hour by being subjected to a temperature of from about 105 to about 150 degrees centigrade; in this embodiment, the drying also serves to remove the polyvinyl alcohol from the green body.

It is also preferred prior to densification to remove substantially all of the organic material in the green body from the green body so that the green body contains less than about 1.0 weight percent of such organic matter. This debindering can also be accomplished by conventional means, by heating the green body until the organic matter in it is burned out. As is known to those skilled in the art, the debindering conditions will vary with factors such as the type(s) and concentration(s) of the organic material in the green body, the thickness of the green body, etc. By way of illustration, in one embodiment in which the green body contains about 8 weight percent of an organic binder, the green body is heated over a period of from about 8 to about 24 hours, in various steps, to temperatures of 150–180, 250, 400–800, and 800–1100 degrees centigrade.

It is often required to heat the green body to a temperature of at least about 800 degrees centigrade to burn out the hydrocarbon matter in it.

Densifying the debindered green body

It is preferred to provide a green body for densifying which contains less than about 0.1 percent moisture and less than about 1.0 percent of organic matter. This green body is preferably densified by heating it under nitrogen to a temperature of from about 1,650 to about 1,700 degrees centigrade for from about 1 to about 4 hours. The densified body formed by this process contains at least 73 weight percent of a material of the formula $Si_{6-z}Al_zO_zN_{8-z}$, wherein z is preferably about 3.0.

The green-body of this invention, which is comprised of applicants' beta-sialon material, may be densified without pressure. Thus, in one preferred embodiment, the pressure on the system is substantially ambient, ranging from about 760 to about 800 Torr.

The green body of this invention, which is comprised of applicant's beta-sialon material, may be densified without the use of a sintering aid.

By way of illustration, in one experiment the beta-sialon material was mixed with "METHOCEL" binder and pressed into a pallet. The pallet was packed in a powdered mixture of 40 percent boron nitride/60 percent sialon and was sintered at 1,680 degrees Centigrade for 3.0 hours under flowing nitrogen at atmospheric pressure. In this experiment, the sintered material had a density of 3.25 grams per cubic centimeter, a flexural strength of 970 megapascals, an elastic modulus of 290 gigapascals, a hardness of 16 gigapascals, a fracture toughness of 5.6, and a thermal shock resistance of 1,100 degrees Centigrade.

In one preferred embodiment, the debindered body is sintered with a specified sintering cycle. In this cycle, the body may be sintered while exposed to a nitrogen environment, without being contacted with any other material except the support on which it rests. Alternatively, the body may be sintered after it has been packed with powder.

In one embodiment, it is preferred to sinter the beta-sialon debindered body after it has been packed in a ceramic powder. It is preferred, in this embodiment, to pack the debindered green body in a nitride powder such as, e.g., boron nitride powder, and/or silicon nitride powder, and/or sialon powder, and/or mixtures thereof. In general, the packing powder should have a particle size such that substantially all of its particles are smaller than 53 microns. In one aspect of this embodiment, boron nitride comprises part of all of the packing powder(s); the use of such boron nitride helps prevent the agglomeration of the packing powder.

In this aspect of this embodiment, it is preferred to pack the green body so that substantially none of its surface is directly exposed to the atmosphere in the furnace.

The atmosphere used during sintering is preferably nitrogen-containing gas and will comprise or consist, e.g., of nitrogen, mixtures of nitrogen and inert gas (such as argon), mixtures of nitrogen with hydrogen, and the like. In those embodiments wherein mixtures of nitrogen are used with one or more other gases, it is preferred that such mixtures contain at least about 75 volume percent of nitrogen.

In the sintering process, the debindered green body may be placed into a furnace. Thereafter, after the furnace has been flooded with the nitrogen-containing gas, the temperature of the furnace is raised from ambient to a temperature of from about 1230 to about 1,270 degrees centigrade at a rate of from about 10 to about 20 degrees per minute. It is more preferred to raise the temperature to about 1250 degrees centigrade at a rate of from about 15 to about 20 degrees centigrade. During this cycle, the nitrogen-containing gas is flowed over the debindered green body at a flow rate of from about 2 to about 12 liters per minute.

After the material has been raised to its temperature of from about 1230 to about 1270 degrees centigrade, it is held at this temperature for at least about 30 minutes while the nitrogen-containing gas continues to flow over the green body. Thereafter, it is raised from its temperature of 1230-1270 to a higher temperature of from about 1650 to about 1700 degrees centigrade at a rate of from about 5 to about 10 degrees centigrade per minute. Once it reaches this higher temperature, it is maintained within this temperature range for at least about 1.0 hour while being contacted with flowing nitrogen. However, in this stage, it is preferred to reduce the flow rate of the nitrogen so that such flow rate will not exceed about 4 liters per minute and, preferably, will be at least about 10 percent lower than the flow ate used in the first part of the process.

After the material has been heated at its temperature of 1650 to 1700 degrees Centigrade, it is then allowed to cool while being contacted with flowing nitrogen. It preferably is cooled to ambient at a rate of no greater than 25 degrees Centigrade per minute.

The properties of the sintered material obtained by the process of this invention are improved. Thus, for example, the sintered body produced from a green body packed in ceramic powder will generally have a bulk density of from about 3.2 to about 3.3 grams per cubic centimeter, a hardness of from about 14 to about 16 gigapascals, an elastic modulus of from about 260 to about 290 gigapascals, a flexural strength of from about 600 to about 960 megapascals, a fracture toughness (indentation) of from about 5.2 to about 5.6, a coefficient of thermal expansion of from about 3.04 to about $3.08 \times 10^{-6}$/degrees centigrade, a thermal conductivity of from about 21 to about 23 watts/meter degrees Kelvin, a thermal shock resistance of 1,100 degrees centigrade, and a maximum use temperature in air of 1,550 degrees centigrade.

In one embodiment, the oxidation resistance of the sintered material will be such that, after it has been heated to a temperature of at least 1200 degrees Centigrade for 100 hours in air, the mechanical properties of the material will be at least about 90 percent as great as the mechanical properties of the unheated, unaged material.

Use of the beta-sialon material as a sintering aid

The beta-sialon material produced by the process of this invention, preferably after it has been heat-treated by the heat-treatment process of the invention, may be used as a sintering aid with various ceramic materials to produce sintered products with improved properties. Without wishing to be bound to any particular theory, applicants believe that their novel sintering aid forms an intergranular crystalline phase during sintering, rather than the amorphous or glassy phase formed by most other sintering aids. Thus, the sintered product produced with applicants' sintering aid generally has superior physical properties.

In the sintering process of this invention, it is preferred to mill the beta-sialon material until substantially all of its particles are smaller than 5.0 microns. If necessary, the milled beta sialon particles are then dried until they contain less than about 2.0 weight percent of moisture.

The milled and dried beta-sialon particles may then be added to the ceramic material to be sintered. In general, the sintering aid is intimately mixed with the ceramic material.

In general, from about 1.0 to about 25 weight percent of the aforementioned beta-sialon sintering aid is mixed with the ceramic material to be sintered.

In one preferred embodiment, wet-mixing is used to combine the beta-sialon sintering aid with the ceramic material to be sintered; this is feasible inasmuch as the beta-sialon sintering aid is not hydrolyzable in water. Thus, one may ball mill an aqueous slurry comprised of the beta-sialon, water, and the ceramic material to be sintered. After such slurry has been well mixed, one may form a green body from it by conventional means and, thereafter, sinter the green body.

In one preferred embodiment, the ceramic material to be sintered is cordierite. As is known to those skilled in the art, cordierite is a silicate of the formula $2MgO.2Al_2O_3.5SiO_2$; see, for example, page 57 of the January, 1989 issue of Ceramic Industry. In this embodiment, the addition of from about 5 to about 15 weight percent of the beta-sialon sintering aid produces a sintered composite material with substantially improved refractoriness, thermal shock resistance, and mechanical strength.

In another preferred embodiment, the ceramic material to be sintered is mullite. As is known to those skilled in the art, mullite is a refractory aluminosilicate of the formula $3Al_2O_3.2SiO_2$; see, e.g., page 86 of the January, 1989 issue of Ceramic industry. In this embodiment, addition of from about 2 to about 8 weight percent of the sialon sintering aid produces a sintered material with substantially improved creep resistance, thermal shock resistance, and microhardness.

In yet another preferred embodiment, the ceramic material is alumina. The addition of from about 2 to about 10 weight percent of the beta-sialon sintering aid produces an alumina with increased microhardness and thermal shock resistance.

In yet another preferred embodiment, the ceramic material to be sintered is zirconia which, preferably, has been partially stabilized with stabilizers such as alumina, magnesisa, calcia, yttria, ceria, and the like. The addition of from about 5 to about 15 weight percent of the sialon sintering aid produces a sintered zirconia body with substantially diminished porosity, increased bulk density, and improved microhardness. It should be noted that, in this embodiment, the beta-sialon not only acts as a sintering aid but also acts to stabilize the zirconia.

In yet another embodiment, the ceramic material to be sintered is magnesia. In this embodiment, the addition of from about 1 to about 5 weight percent of the sialon sintering aid substantially improves the properties of the sintered body.

In yet another embodiment, the ceramic material to be sintered is silicon carbide powder. In this embodiment, the use of from about 10 to about 20 weight percent of the beta-sialon sintering results in a sintered product with higher bulk density and lower apparent porosity. The use of substantially the same concentration of beta-sialon sintering aid with other carbide materials (such as titanium carbide, tungsten carbide, and the like) produces substantially similar and advantageous results.

In yet another preferred embodiment, the ceramic material to be sintered is silicon nitride. In this embodiment, the use of from about 5 to about 20 weight percent of the sialon sintering aid produces a sintered material with improved mechanical and thermal properties. It will be appreciated that the beta-sialon sintering aid may be used at 5-20 weight percent concentration with other nitrides, such as titanium nitride, tantalum nitride, aluminum nitride, and the like.

Unlike prior art sintering aids (such as yttria/alumina), applicants' beta-sialon sintering aid is relatively inexpensive and, at the very least, produces a sintered product whose properties are not degraded by the presence of the sintering aid.

Suppression of crystal growth in the sintered beta-sialon

In one embodiment of this invention, the crystal growth of the beta-sialon material is suppressed during sintering. One may suppress such crystal growth by well known techniques. Thus, for example, one may add a crystal growth suppressant to the milled beta-sialon material. Alternatively, one may add a crystal growing supplier to the unignited pellet and/or to the material used to form such pellet so that, during combustion, a crystal growth suppressor is synthesized in situ and homogeneously dispersed throughout the combusted material.

In one embodiment, the crystal growth suppressor is an oxide or a mixture of oxides, such as, e.g., magnesium oxide, magnesium silicate, magnesium aluminum silicate, magnesium aluminate, and the like.

In another embodiment, the crystal growth suppressor is a non-oxide material such as, e.g., silicon carbide, titanium diboride, boron carbide, mixtures thereof and the like.

In yet another embodiment, mixtures of oxide and nonoxide materials may be used.

In this embodiment, the beta-sialon material which is formed into a green body and sintered has superior mechanical properties.

The following examples are presented to illustrate the claimed invention and are not to be deemed limitative thereof. Unless otherwise specified, all parts are by weight, and all temperatures are in degrees centigrade.

Examples

Example 1

47 grams of silica (catalog number 13024, Johnson Matthey/AESAR Group) were charged to a stainless steel vessel with a capacity of about 250 cubic centimeters (part 27-17-229-6, Brinkman Instruments Company, Cantiague Road, Westbury, N.Y. 11590) along with grinding media consisting of 18 tungsten carbide cycloids having a 8 millimeter diameter, a 16.0 millimeter length, and and a total weight of 306 grams. The vessel was then covered with a stainless steel lid, and the covered vessel was then introduced into a Brinkman centrifugal ball mill (Centrifugal Ball Mill S-1, Brinkman Instruments Company, see page 38 of the R1 catalog) and comminuted for about 3.0 hours at a speed of 540 revolutions per minute. After such comminution, the lid was removed, and 35 grams of aluminum powder (type 1401T, Aluminum Company of America) were added. The vessel was then covered with an aluminum aeration cover (part number 27-16-219-3, Brinkman Instruments Company). This aluminum cover permitted the introduction of nitrogen gas during comminution.

The mixture was then again comminuted in the ball millwhile being contacted with flowing nitrogen at a flow rate of about 2.0 liters per hour; the comminution occurred over a period of about 3.0 hours at a speed of 540 revolutions per minute.

The comminuted material was discharged from the vessel, and pellets of 1.125 inch diameter were pressed in a cylindrical die with a Carver Lab Press 13-872 (see page 897 of the Fisher '88 Catalog, Fisher Scientific Company); a pressure of 3 tons was used.

The pellets were charged into a graphite boat. The boat was then placed into a graphite reactor and, while under a nitrogen atmosphere, was heated to a temperature of about 700 degrees centigrade, at which temperature ignition occurred.

The combusted pellets were cooled by allowing the reactor to return to ambient temperature. The pellets were then removed from the reactor and crushed until their average size was less than about 2.0 millimeter.

The crushed pellets were then milled in a four-liter jar mill operated at a speed of 60 revolutions per minute for 8 hours; zirconia cylinders were used as the grinding media. Thereafter, this material was sieved on a 150 mesh sieve; substantially all of the material passed through the sieve.

The material which passed through the 150 mesh sieve was mixed with 0.05 weight percent of oleic acid, and this mixture was then ground in a four-liter jar mill operated at 60 r.p.m. with zirconia cylinders for about 24 hours. The material produced by this grinding was then sieved with a 325 mesh sieve; substantially all of the material passed through this sieve.

A portion of the material passing through the 325 mesh sieve was subjected to X-ray diffraction analysis. Such analysis indicated that the material contained alumina in excess of 50 weight percent. Two minor phases also were revealed. One of them was silicon, which was present in a concentration in excess of 30 weight percent. The other of them was beta-sialon of the formula $Si_3Al_3O_3N_5$, which was present in a concentration of in excess of 15 weight percent.

A portion of the sieved material was subjected to analysis by Scanning Electron Microscope and Energy Dispersive Spectrometry, using the methods and apparatuses described in the specification. Such analysis indicated that the silicon phase in the material was associated with a content of aluminum, oxygen, and nitrogen.

The sieved material was charged into a 2.5 inch diameter furnace tube obtained from the McDanel Refractory Company of Beaver Falls, Pa. The furnace tube/sieved material assembly was then placed into a graphite element furnace, available as model number 1000-45120-FP30 from Thermal Technology, Inc., Astro Division, of Santa Barbara, Calif. This furnace was equipped with a nitrogen source.

The furnace door was closed, the furnace was purged with nitrogen, and nitrogen was caused to flow from one end of the tube to another through the material. The temperature of the furnace was raised from ambient to a temperature of 900 degrees centigrade at a rate of 10 degrees per minute.

Nitrogen was flowed over the sieved material as its temperature was being raised. The nitrogen flow was about 4 liters per minute.

Once the sieved material had reached the temperature of 900 degrees centigrade, it was maintained at this temperature for 30 minutes while the nitrogen flow was reduced to 1 liter per minute and the nitrogen pressure was increased to 15 p.s.i.g. After this initial heat treatment, the temperature of furnace was then raised to 1,250 degrees centigrade at a rate of 10 degrees per minute. During this temperature increase, the nitrogen pressure and flow rate was maintained as before.

Once the material had reached the temperature of 1250 degrees centigrade, it was maintained at this temperature for 45 minutes. During this time, the nitrogen vent was closed so that the flow rate was substantially zero; the pressure in the reactor was about 16 p.s.i.g.

After the material had been maintained at 1250 degrees centigrade for 45 minutes, its temperature was then raised to 1,450 degrees centigrade at a rate of 10 degrees per minute. The nitrogen flow rate was 1 liter per minute, and the pressure was 15 p.s.i.g.

Once the material had reached the temperature of 1450 degrees centigrade, it was maintained at such temperature for 90 minutes. The nitrogen flow rate was 1 liter per minute, and the pressure was 15 p.s.i.g.

Thereafter, the material was cooled to a temperature of 900 degrees centigrade. During this cooling, the nitrogen flow rate was 1 liter per minute, and the pressure was 15 p.s.i.g. The rate of cooling was 10 degrees per minute.

Once the material had been cooled to a temperature of 900 degrees centigrade, it was then allowed to cool to ambient without any external cooling means; cooling was allowed to occur over a period of about 60 minutes. During this cooling, the nitrogen flow rate was 4 liters per minute, and the pressure was about 2 p.s.i.g.

The cooled material was removed from the furnace and crushed so that substantially all of its particles were smaller than 0.5 millimeters. Thereafter, the crushed material was passed through a twin-deck vibratory sieve whose first sieve was 150 mesh and whose second sieve was 325 mesh.

The heat-treated material passing through the 325 mesh screen was then analyzed to determine its composition.

X-ray diffraction analysis indicated that material contained two major phases. The aforementioned beta-sialon material was present as a major phase at a concentration in excess of 70 weight percent. The aforementioned alpha-alumina was present as a major phase at a content in excess of 25 weight percent.

Example 2

2,714 grams of the heat-treated, sieved material produced in Example 1 were mixed in a one-gallon plastic bottle with 13.5 grams of oleic acid (catalog number OL 103, Spectrum Chemical Manufacturing Company, Gardena, Calif.) and 1,837 grams of 0.5 inch diameter zirconia media for 10 hours in a roller mill at a speed of 190 revolutions per minute. The mixed material was discharged from the plastic bottle and then pressed in a cylindrical die (1.125 diameter) with a Carver Laboratory Press, model number 13-872, available from the Fisher '88 Catalog (Fisher Scientific Company); a pressure of 7 tons was used. Each of the pellets so produced weighed about 10 grams.

The pellets were then debindered. They were placed into a Neytech 85N muffle furnace (available from the NEY Company, Barkmeyer Division, Yucaipa, Calif.) and heated to a temperature of 400 degrees centigrade; they were then maintained at this temperature for 2 hours.

The debindered pellets were then measured and, after being measured, were charged into the Thermal Technology, Inc. graphite furnace. The pellets were first placed onto a refractory plate made of alumina, and the plate containing the pellets was then placed into the aforementioned 2.5 inch McDanel furnace tube.

Nitrogen was flowed through the ends of the furnace tube at a rate of 4 liters per minute, and the nitrogen pressure on the pellets was 5 p.s.i.g.

The temperature was raised from ambient to 1,200 degrees centigrade at a rate of 15 degrees per minute while maintaining the same nitrogen flow rate and pressure. Thereafter, the 1,200 degree centigrade temperature was maintained for 30 minutes while the nitrogen flow was reduced to 1 liter per minute; the nitrogen pressure was increased to 15 p.s.i.g.

Thereafter, the temperature was increased to 1,650 degrees centigrade at a rate of 10 degrees per minute while the nitrogen flow rate and pressure were maintained as before.

Once the pellets reached a temperature of 1,650 degrees centigrade, they were held at this temperature for 90 minutes while the nitrogen flow rate and pressure were maintained as before.

Thereafter, the furnace was cooled to 900 degrees centigrade at a rate of 15 degrees per minute; during this cooling, the nitrogen pressure was 15 p.s.i.g., and the nitrogen flow rate was increased to 4 liters per minute.

Once the temperature had reached 900 degrees centigrade, the furnace was allowed to cool to ambient over a period of about 60 minutes; during this cooling, the nitrogen pressure was reduced to 4 p.s.i.g. and the nitrogen flow rate was maintained at 4 liters per minute.

The cooled pellets were then measured to determine their shrinkage. The difference in the maximum dimension of each pellet was used to determine shrinkage. The average linear shrinkage of the pellets was 18 percent (in diameter) and 17 percent (in thickness). The volume shrinkage was 40 percent.

The density and water absorption of the pellets also were determined by immersing them in water and boiling them in water for one hour. The average density was 3.19 grams per cubic centimeter (which was 97 percent of the pellets' theoretical, calculated density); the average water absorption was 1.6 percent.

The elastic modulus of the pellets was determined in accordance with A.S.T.M. test C-848-78. The average elastic modulus of the pellets was 291 gigaPascals.

The flexural strength of the pellets was determined in accordance with A.S.T.M. test F-417-78. The average flexural strength was 486 megaPascals.

The hardness and fracture toughness of the pellets were determined by indentation. The average hardness was 14 gigaPascals The average fracture toughness was 3.9 megaPascals per/meter$^{0.5}$.

The wear resistance of the pellets were determined by a wet test in accordance with A.S.T.M. B-611. The pellets lost about 24 cubic millimeters of material after 100 revolutions.

Example 3

The procedure of Example 2 was substantially followed, with the exceptions the pellets were sintered at a final temperature at 1,680 degrees centigrade for 180 minutes, the nitrogen flow during the entire sintering cycle was 4 liters per minute, and the nitrogen pressure during such cycle was 2 p.s.i.g.

The cooled pellets were measured and evaluated in accordance with the procedure of Example 2.

The average linear shrinkage of the pellets was 17 percent (in diameter) and 16 percent (in thickness). The volume shrinkage was 40 percent.

The density and water absorption of the pellets also were determined. The average density was 3.22 grams per cubic centimeter; the average water absorption was 0.8 percent.

The average elastic modulus of the pellets was 318 GigaPascals. The average flexural strength was 623 megaPascals. The average hardness was 16 GigaPascals. The average fracture toughness was 5.6 megaPascals per/meter$^{0.5}$. The wear resistance test indicated that the pellets lost about 22 cubic millimeters of material after 100 revolutions.

Example 4

The procedure of Example 1 was substantially followed, with the exception that 42.0 grams of silicon dioxide were charged to the mill together with 8.2 grams of silicon nitride and 2.4 grams of aluminum nitride After the first comminution in the ball mill, the reaction vessel was opened, ad 31.4 grams of aluminum powder were added.

X-ray diffraction analysis of the combusted material which had not yet been heat-treated revealed the presence of alumina in excess of 45 weight percent, silicon in excess of 25 weight percent, the aforementioned beta-sialon in excess of 15 weight percent, and silicon nitride in a concentration of about 5.0 weight percent; traces of aluminum nitride also were present.

X-ray analysis of the heat-treated material revealed the presence of the aforementioned beta-sialon in excess of 80 weight percent, alumina in excess of 15 weight percent, no traces of silicon nitride, and no traces of aluminum nitride.

Example 5

The procedure of Example 1 was substantially followed, with the exception that 37.8 grams of silicon dioxide were charged to the mill together with 14.7 grams of silicon nitride and 4.3 grams of aluminum nitride After the first comminution in the ball mill, the reaction vessel was opened, and 28.4 grams of aluminum powder were added.

X-ray analysis of the heat-treated material revealed the presence of the aforementioned beta-sialon in excess of 90 weight percent, alumina in excess of 5 weight percent, no traces of silicon nitride, and no traces of aluminum nitride.

Example 6

The procedure of Example 1 was substantially followed, with the exception that 34.6 grams of silicon dioxide were charged to the mill together with 20.2 grams of silicon nitride and 6.0 grams of aluminum nitride After the first comminution in the ball mill, the reaction vessel was opened, and 26.0 grams of aluminum powder were added.

X-ray analysis of the heat-treated material revealed the presence of the aforementioned beta-sialon in excess of 95 weight percent, traces of alumina, no traces of silicon nitride, and no traces of aluminum nitride.

Example 7

The procedure of Example 2 was substantially followed, with the exceptions that the composite material which was sintered was the composition of Example 5 and the pellets were sintered at a final temperature at 1,680 degrees centigrade for 180 minutes.

The cooled pellets were measured and evaluated in accordance with the procedure of Example 2.

The average linear shrinkage of the pellets was 17 percent (in diameter) and 17 percent (in thickness). The volume shrinkage was 40 percent.

The density and water absorption of the pellets also were determined. The average density was 3.19 grams per cubic centimeter; the average water absorption was about 1 percent.

The average elastic modulus of the pellets was about 300 GigaPascals. The average flexural strength was 550 megaPascals. The average hardness was 15 GigaPascals. The average fracture toughness was greater than 6.0 megaPascals per/meter$^{0.5}$. The wear resistance test indicated that the pellets lost about 24 cubic millimeters of material after 100 revolutions.

Example 8

The heat-treated and sieved material of Example 5 was subjected to particle size analysis. Ten percent of its particles were smaller than 5.46 microns, 50 percent of its particles were smaller than 16.06 microns, 90 percents of its particles were smaller than 53.04 microns, the median particle size was 25.06 microns, and the material had a specific surface area of 1.65 square meters per gram.

1,400 grams of the heat-treated and sieved material of Example 5 were charged to a 1.6-gallon capacity jar mill along with 10,800 grams of yttria-stabilized grinding media having a 5.0 millimeter diameter and 1,000 milliliters of deionized water. The mill was run at a speed of 50 revolutions per minute for 24 hours.

After the wet-milling of the material, slurry was discharged to a porcelain capsule and dried at a temperature of about 60 degrees centigrade until its moisture content was less than 2.0 weight percent.

The dried, milled material was then subjected to particle size analysis. Ten percent of its particles were smaller than 1.15 microns, 50 percent of its particles were smaller than 2.31 microns, 90 percent of its particles were smaller than 3.51 microns, the median particle size was 2.32 microns, and the material had a specific surface area of 6.85 square meters per gram.

Example 9

The procedure of Example 8 was repeated with the exception that isopropyl alcohol was used instead of deionized water. The specific surface area of the dried, milled powder obtained in this experiment was 3.0 square meters per gram.

It is to be understood that the aforementioned description is illustrative only and that changes can be made in the apparatus, the ingredients and their proportions, and in the sequence of combinations and process steps as well as in other aspects of the invention discussed herein without departing from the scope of the invention as defined in the following claims.

We claim:

1. A precursor material comprised of at least 16 weight percent of a sialon material of the formula $Si_{6-z}Al_zO_zN_{8-z}$, from about 54 to about 28 weight percent of alumina, from about 0 to about 8 weight percent of aluminum nitride, from about 0 to about 25 weight percent of silicon nitride, and from about 30 to about 24 weight percent of free silicon, wherein:
   (a) said sialon material is comprised of from about 35 to about 25 weight percent of silicon, from about 24 to about 33 weight percent of aluminum, from about 14 to about 20 weight percent of oxygen, and from about 27 to about 22 weight percent of nitrogen,
   (b) said z is from about 2.5 to about 3.5,
   (c) said aluminum nitride is comprised of less than about 2.0 weight percent of combined oxygen, has substantially all of its particles smaller than about 53 microns, and comprises less than about 0.1 percent of moisture,
   (d) said silicon nitride is comprised of at least about 35 weight percent of nitrogen, less than about 2.0 weight percent of oxygen, and less than about 1.0 weight percent of free silicon, and
   (e) substantially all of the particles of silicon nitride are smaller than about 10 microns.

2. The precursor material as recited in claim 1, wherein at least about 90 weight percent of said free silicon is in the form of a silicon whisker.

3. The precursor material as recited in claim 2, wherein said silicon whisker has a diameter of from about 3 to about 7 microns and a length of from about 50 to about 300 microns.

4. The precursor material as recited in claim 1, wherein substantially all of the particles of said precursor material are from about 0.1 to about 0.5 millimeters in size.

5. The precursor material as recited in claim 1, wherein at least 95 weight perent of the particles of said precursor material are smaller than 53 microns in size.

6. A mixture consisting essentially of from about 5 to about 30 weight percent of the precursor material recited in claim 1 and an inorganic material selected from the group consisting of silicon carbide, silicon nitride, titanium nitride, boron nitride, boron carbide, and mixtures thereof.

* * * * *